(12) United States Patent
Todorokihara

(10) Patent No.: US 8,508,213 B2
(45) Date of Patent: *Aug. 13, 2013

(54) FREQUENCY MEASUREMENT DEVICE

(75) Inventor: Masayoshi Todorokihara, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 68 days.

This patent is subject to a terminal disclaimer.

(21) Appl. No.: 12/782,382

(22) Filed: May 18, 2010

(65) Prior Publication Data

US 2010/0295535 A1    Nov. 25, 2010

(30) Foreign Application Priority Data

May 20, 2009   (JP) ................................. 2009-121509

(51) Int. Cl.
*G01R 23/02* (2006.01)

(52) U.S. Cl.
USPC .................. 324/76.39; 324/76.41; 324/76.44; 324/76.48; 324/76.47; 327/47; 327/48; 327/49; 377/19; 377/47; 377/48; 377/49; 377/105; 377/121

(58) Field of Classification Search
USPC .......... 324/76.39, 76.41, 76.44, 76.48, 76.47; 377/19, 47–49, 105, 121; 327/47–49
See application file for complete search history.

(56) References Cited

U.S. PATENT DOCUMENTS

| | | | |
|---|---|---|---|
| 2,627,033 A * | 1/1953 | Jensen et al. ............... | 324/76.44 |
| 2,840,812 A | 6/1958 | Di Giacomo | |
| 2,944,219 A | 7/1960 | Tanaka et al. | |
| 3,026,473 A | 3/1962 | De Mott | |
| 3,056,085 A | 9/1962 | James et al. | |
| 3,144,623 A | 8/1964 | Steiner | |
| 3,227,952 A * | 1/1966 | Proebster et al. .......... | 324/76.48 |
| 3,310,660 A | 3/1967 | Cogar | |
| 3,372,346 A | 3/1968 | Rogers et al. | |
| 3,407,290 A | 10/1968 | Atrubin | |
| 3,440,617 A * | 4/1969 | Lesti ............................ | 382/224 |

(Continued)

FOREIGN PATENT DOCUMENTS

| | | |
|---|---|---|
| JP | 53-111768 | 9/1978 |
| JP | A-56-169923 | 12/1981 |

(Continued)

OTHER PUBLICATIONS

Katano, K., "Introduction to Proper Method for Using MeasuringInstruments; How to Use Timing Devices," Transistor Technology Seminar, 14th Installment, Feb. 1994, p. 331-338 (with English translation).

(Continued)

*Primary Examiner* — Jermele M Hollington
*Assistant Examiner* — Lamarr Brown
(74) *Attorney, Agent, or Firm* — Oliff & Berridge, PLC

(57) ABSTRACT

A frequency measurement device for measuring a frequency of a signal to be measured including a pulse signal, includes: a signal multiplier section that multiplies the signal to be measured by n (n is an integer) and outputs a multiplied signal; a counter section that counts the multiplied signal with a predetermined gate time and outputs a count value of the frequency of the signal to be measured at a predetermined period; and a low-pass filter that outputs a signal corresponding to the frequency of the signal to be measured based on the count value outputted at the predetermined period.

4 Claims, 14 Drawing Sheets

(56) References Cited

U.S. PATENT DOCUMENTS

| | | | | |
|---|---|---|---|---|
| 3,486,007 A | * | 12/1969 | Jacobson | 377/55 |
| 3,551,826 A | | 12/1970 | Sepe | |
| 3,553,579 A | * | 1/1971 | Teixeira | 324/76.82 |
| 3,557,796 A | | 1/1971 | Keller et al. | |
| 3,605,017 A | | 9/1971 | Chertok et al. | |
| 3,609,308 A | | 9/1971 | Lemon et al. | |
| 3,624,494 A | | 11/1971 | Turan | |
| 3,652,838 A | | 3/1972 | Dillon et al. | |
| 3,686,565 A | | 8/1972 | Kelem et al. | |
| 3,697,870 A | | 10/1972 | Brenner | |
| 3,704,414 A | | 11/1972 | Herbst | |
| 3,708,686 A | | 1/1973 | Butler, Jr. et al. | |
| 3,733,471 A | | 5/1973 | Gilberg | |
| 3,736,510 A | | 5/1973 | Wu | |
| 3,742,353 A | | 6/1973 | Parisi | |
| 3,743,940 A | | 7/1973 | Yamagata | |
| 3,745,380 A | | 7/1973 | Kitajima et al. | |
| 3,750,014 A | | 7/1973 | Gaw | |
| 3,755,734 A | | 8/1973 | Blanyer | |
| 3,761,740 A | | 9/1973 | Naïve | |
| 3,766,818 A | * | 10/1973 | Prohofsky | 84/454 |
| 3,775,681 A | * | 11/1973 | Konrad | 324/76.68 |
| 3,777,121 A | | 12/1973 | Jamieson | |
| 3,780,346 A | | 12/1973 | Gagnon | |
| 3,795,771 A | | 3/1974 | Gundersen et al. | |
| 3,803,487 A | * | 4/1974 | Iten | 324/76.62 |
| 3,812,427 A | * | 5/1974 | Coulter | 324/76.48 |
| 3,823,374 A | | 7/1974 | Dandliker et al. | |
| 3,838,338 A | * | 9/1974 | Khoury | 324/76.47 |
| 3,875,518 A | | 4/1975 | Odams | |
| 3,930,199 A | * | 12/1975 | Valis | 324/76.62 |
| 3,942,123 A | * | 3/1976 | Georgi | 324/600 |
| 3,943,460 A | * | 3/1976 | Arai | 331/16 |
| 4,041,387 A | * | 8/1977 | Dalichow et al. | 324/76.62 |
| 4,051,434 A | | 9/1977 | Sweet | |
| 4,063,169 A | * | 12/1977 | Palmer | 324/76.56 |
| 4,130,799 A | | 12/1978 | Cherry | |
| 4,137,497 A | | 1/1979 | Lowenschuss | |
| 4,139,819 A | * | 2/1979 | Worley | 324/76.59 |
| 4,139,870 A | | 2/1979 | Tachi | |
| 4,144,490 A | * | 3/1979 | Stevens | 324/76.62 |
| 4,150,432 A | * | 4/1979 | Sorden | 702/78 |
| 4,169,213 A | | 9/1979 | Dye et al. | |
| 4,310,891 A | * | 1/1982 | Niki | 702/75 |
| 4,339,722 A | | 7/1982 | Sydor et al. | |
| 4,345,206 A | * | 8/1982 | Skalka | 324/76.44 |
| 4,368,354 A | | 1/1983 | Furihata et al. | |
| 4,374,358 A | | 2/1983 | Hirose | |
| 4,389,642 A | | 6/1983 | Kahn | |
| 4,420,809 A | * | 12/1983 | Pierce | 702/78 |
| 4,494,067 A | | 1/1985 | Barszczewski | |
| 4,514,592 A | | 4/1985 | Miyaguchi | |
| 4,544,892 A | * | 10/1985 | Kaufman et al. | 324/334 |
| 4,546,490 A | | 10/1985 | Miller-Thomson et al. | |
| 4,583,211 A | | 4/1986 | Nishikawa et al. | |
| 4,588,979 A | | 5/1986 | Adams | |
| 4,603,292 A | | 7/1986 | Russell | |
| 4,609,990 A | | 9/1986 | Sember et al. | |
| 4,616,173 A | | 10/1986 | Cook et al. | |
| 4,651,089 A | | 3/1987 | Haigh | |
| 4,667,689 A | | 5/1987 | Kohashi | |
| 4,670,712 A | * | 6/1987 | Lavergnat et al. | 324/76.39 |
| 4,672,556 A | | 6/1987 | Shepler | |
| 4,695,791 A | | 9/1987 | Miller | |
| 4,695,792 A | | 9/1987 | Roy | |
| 4,707,653 A | | 11/1987 | Wagner | |
| 4,716,363 A | | 12/1987 | Dukes et al. | |
| 4,760,536 A | | 7/1988 | Curtis | |
| 4,769,836 A | | 9/1988 | Aihara | |
| 4,795,963 A | * | 1/1989 | Ueno et al. | 341/120 |
| 4,864,588 A | | 9/1989 | Simpson et al. | |
| 4,864,634 A | | 9/1989 | Nakagawa et al. | |
| 4,880,005 A | | 11/1989 | Pless et al. | |
| 4,984,254 A | * | 1/1991 | Thomas | 375/354 |
| 5,027,228 A | | 6/1991 | Yokoyama | |
| 5,065,095 A | | 11/1991 | Suzuki | |
| 5,095,279 A | | 3/1992 | Quan et al. | |
| 5,122,758 A | | 6/1992 | Tomita | |
| 5,128,607 A | | 7/1992 | Clark et al. | |
| 5,157,699 A | * | 10/1992 | Miyazaki et al. | 377/28 |
| 5,206,549 A | | 4/1993 | Suzuki et al. | |
| 5,262,714 A | * | 11/1993 | Friedman | 324/76.42 |
| 5,302,916 A | | 4/1994 | Pritchett | |
| 5,304,938 A | | 4/1994 | Gregory et al. | |
| 5,313,154 A | | 5/1994 | Norris | |
| 5,317,215 A | | 5/1994 | Kranzler | |
| 5,323,096 A | | 6/1994 | Nakai | |
| 5,365,181 A | | 11/1994 | Mair | |
| 5,381,085 A | | 1/1995 | Fischer | |
| 5,442,278 A | | 8/1995 | Fan Chiang et al. | |
| 5,448,606 A | | 9/1995 | Snelgrove | |
| 5,509,040 A | | 4/1996 | Shimada | |
| 5,539,355 A | | 7/1996 | Nakamura | |
| 5,555,247 A | | 9/1996 | Matsuoka et al. | |
| 5,650,954 A | | 7/1997 | Minuhin | |
| 5,652,552 A | | 7/1997 | Chung | |
| 5,710,710 A | * | 1/1998 | Owen et al. | 702/75 |
| 5,764,045 A | * | 6/1998 | Hayashi | 324/76.48 |
| 5,941,974 A | | 8/1999 | Babin | |
| 6,018,560 A | | 1/2000 | Kim | |
| 6,078,200 A | | 6/2000 | Miyano | |
| 6,127,950 A | | 10/2000 | Yamauchi | |
| 6,140,869 A | | 10/2000 | Troise | |
| 6,172,579 B1 | | 1/2001 | Dacus et al. | |
| 6,181,829 B1 | * | 1/2001 | Clark et al. | 382/273 |
| 6,259,251 B1 | | 7/2001 | Sugiura et al. | |
| 6,265,869 B1 | | 7/2001 | Takahashi | |
| 6,282,803 B1 | | 9/2001 | Dunne | |
| 6,359,938 B1 | | 3/2002 | Keevill et al. | |
| 6,360,090 B1 | | 3/2002 | Holcombe et al. | |
| 6,377,616 B1 | | 4/2002 | Brankovic et al. | |
| 6,463,452 B1 | | 10/2002 | Schulist | |
| 6,519,194 B2 | | 2/2003 | Tsujino et al. | |
| 6,549,479 B2 | | 4/2003 | Blodgett | |
| 6,590,400 B2 | | 7/2003 | Hilliard et al. | |
| 6,665,367 B1 | | 12/2003 | Blair | |
| 6,674,277 B1 | | 1/2004 | Oishi et al. | |
| 6,675,326 B1 | | 1/2004 | Yoshizaki | |
| 6,680,607 B2 | | 1/2004 | Smith | |
| 6,759,838 B2 | * | 7/2004 | Tao et al. | 324/76.53 |
| 6,888,902 B1 | | 5/2005 | Kondo | |
| 6,917,191 B2 | | 7/2005 | Oishi et al. | |
| 7,027,940 B2 | | 4/2006 | Iannuzzi | |
| 7,046,964 B1 | | 5/2006 | Sullivan et al. | |
| 7,068,744 B2 | | 6/2006 | Watanabe | |
| 7,230,458 B2 | | 6/2007 | DaDalt | |
| 7,242,223 B1 | * | 7/2007 | Alon | 327/39 |
| 7,265,559 B1 | * | 9/2007 | Hladky et al. | 324/700 |
| 7,266,756 B2 | | 9/2007 | Saado et al. | |
| 7,271,631 B2 | * | 9/2007 | Watanabe | 327/115 |
| 7,276,978 B2 | * | 10/2007 | Puma et al. | 331/16 |
| 7,285,961 B2 | | 10/2007 | Shinmoto et al. | |
| 7,372,875 B2 | | 5/2008 | Hadzic et al. | |
| 7,394,723 B2 | | 7/2008 | Rubin | |
| 7,429,896 B2 | * | 9/2008 | Hattori | 331/44 |
| 7,436,265 B2 | | 10/2008 | Park et al. | |
| 7,463,096 B2 | | 12/2008 | Chi et al. | |
| 7,466,789 B2 | | 12/2008 | Rieubon et al. | |
| 7,504,976 B1 | | 3/2009 | Pellon | |
| 7,636,747 B2 | | 12/2009 | Watanabe | |
| 7,692,419 B1 | * | 4/2010 | Peel | 324/76.48 |
| 7,729,071 B2 | | 6/2010 | Harada | |
| 7,737,688 B2 | | 6/2010 | Tomida et al. | |
| 7,750,618 B1 | | 7/2010 | Fang et al. | |
| 7,907,016 B2 | * | 3/2011 | Eikenbroek | 331/16 |
| 8,139,685 B2 | | 3/2012 | Simic et al. | |
| 8,242,941 B2 | | 8/2012 | Arknaes-Pedersen et al. | |
| 2001/0045868 A1 | * | 11/2001 | Takeyabu et al. | 331/2 |
| 2002/0024343 A1 | | 2/2002 | Moore | |
| 2002/0097091 A1 | | 7/2002 | Takagishi | |
| 2002/0167874 A1 | | 11/2002 | Hayashi | |
| 2003/0038624 A1 | | 2/2003 | Hilliard et al. | |
| 2003/0046064 A1 | | 3/2003 | Moriya et al. | |
| 2003/0165112 A1 | | 9/2003 | Noda | |

| | | | |
|---|---|---|---|
| 2003/0176932 A1 | 9/2003 | Wild | |
| 2003/0184346 A1* | 10/2003 | Lamb ............................ 327/12 | |
| 2003/0215100 A1 | 11/2003 | Kimura et al. | |
| 2004/0075425 A1* | 4/2004 | Horio et al. ................. 324/76.48 | |
| 2004/0078737 A1 | 4/2004 | Miyamoto | |
| 2004/0196052 A1* | 10/2004 | Okayasu ....................... 324/617 | |
| 2004/0199345 A1 | 10/2004 | Ananthanarayanan et al. | |
| 2005/0025270 A1 | 2/2005 | Muhammad et al. | |
| 2005/0110500 A1 | 5/2005 | Hoyte et al. | |
| 2005/0147197 A1 | 7/2005 | Perrott | |
| 2005/0237125 A1 | 10/2005 | Hino | |
| 2005/0270043 A1 | 12/2005 | Iacob et al. | |
| 2006/0084386 A1 | 4/2006 | Irie et al. | |
| 2006/0120537 A1 | 6/2006 | Burnett et al. | |
| 2006/0171496 A1 | 8/2006 | Nakamuta et al. | |
| 2006/0246865 A1 | 11/2006 | Makarov | |
| 2006/0267698 A1 | 11/2006 | Erdogan et al. | |
| 2006/0285756 A1 | 12/2006 | Sugita | |
| 2007/0094581 A1 | 4/2007 | Kajita | |
| 2007/0103333 A1 | 5/2007 | Michaiski et al. | |
| 2007/0132442 A1 | 6/2007 | Jones | |
| 2007/0159938 A1 | 7/2007 | Sugawara et al. | |
| 2007/0216556 A1 | 9/2007 | Rieubon et al. | |
| 2008/0019471 A1 | 1/2008 | Waldner | |
| 2008/0068096 A1 | 3/2008 | Feng et al. | |
| 2008/0104072 A1 | 5/2008 | Stampleman et al. | |
| 2008/0136471 A1* | 6/2008 | Kamath ........................ 327/156 | |
| 2008/0165862 A1 | 7/2008 | Takahashi | |
| 2008/0189064 A1 | 8/2008 | Yamaguchi et al. | |
| 2008/0191762 A1 | 8/2008 | Seethamraju et al. | |
| 2008/0204088 A1 | 8/2008 | Garlapati et al. | |
| 2008/0229829 A1 | 9/2008 | Kondo | |
| 2008/0247500 A1 | 10/2008 | Goto et al. | |
| 2008/0291287 A1 | 11/2008 | Dvir | |
| 2008/0320065 A1 | 12/2008 | Kan | |
| 2009/0058452 A1* | 3/2009 | Tanaka et al. .................. 324/765 | |
| 2009/0058468 A1* | 3/2009 | Hjelm et al. .................... 327/40 | |
| 2009/0144018 A1* | 6/2009 | Chang et al. .................. 702/155 | |
| 2009/0153256 A1 | 6/2009 | Jo et al. | |
| 2009/0156150 A1 | 6/2009 | Deleon | |
| 2009/0180527 A1 | 7/2009 | Asami | |
| 2009/0192958 A1 | 7/2009 | Todorokihara | |
| 2009/0240994 A1 | 9/2009 | Lee | |
| 2009/0243736 A1* | 10/2009 | Miura et al. .................... 331/1 R | |
| 2009/0251129 A1* | 10/2009 | Todorokihara et al. .... 324/76.39 | |
| 2009/0261809 A1 | 10/2009 | Li | |
| 2009/0295460 A1 | 12/2009 | Gulba et al. | |
| 2009/0296878 A1* | 12/2009 | Tsai ................................ 377/47 | |
| 2010/0054390 A1 | 3/2010 | Kim et al. | |
| 2010/0091752 A1 | 4/2010 | Kemmochi et al. | |
| 2010/0213924 A1* | 8/2010 | Osumi et al. ................. 324/76.44 | |
| 2010/0295535 A1* | 11/2010 | Todorokihara ............. 324/76.39 | |
| 2010/0295536 A1* | 11/2010 | Todorokihara ............. 324/76.39 | |
| 2010/0295537 A1* | 11/2010 | Todorokihara ............. 324/76.39 | |
| 2010/0315061 A1 | 12/2010 | Tomita et al. | |
| 2011/0050352 A1* | 3/2011 | Kondo et al. .................... 331/46 | |
| 2011/0068828 A1* | 3/2011 | Anderson et al. ............... 327/48 | |
| 2011/0074514 A1 | 3/2011 | Marutani | |
| 2011/0082656 A1* | 4/2011 | Todorokihara .................. 702/78 | |
| 2011/0084687 A1* | 4/2011 | Todorokihara ............. 324/76.19 | |
| 2011/0182398 A1* | 7/2011 | Iwashita et al. ................ 377/19 | |
| 2011/0235772 A1 | 9/2011 | Obkircher | |
| 2012/0019301 A1 | 1/2012 | Murray | |
| 2012/0053903 A1* | 3/2012 | Todorokihara ................ 702/189 | |
| 2012/0161815 A1 | 6/2012 | Polivka | |

FOREIGN PATENT DOCUMENTS

| | | |
|---|---|---|
| JP | A-61-501528 | 7/1986 |
| JP | A-61-223662 | 10/1986 |
| JP | A-62-298726 | 12/1987 |
| JP | A-64-054271 | 3/1989 |
| JP | A-64-57189 | 3/1989 |
| JP | A-02-252306 | 10/1990 |
| JP | A-04-048271 | 2/1992 |
| JP | A-04-072815 | 3/1992 |
| JP | A-4-357468 | 12/1992 |
| JP | A-05-030772 | 4/1993 |
| JP | A-05-172861 | 7/1993 |
| JP | A-6-11525 | 1/1994 |
| JP | A-6-501554 | 2/1994 |
| JP | A-06-164372 | 6/1994 |
| JP | A-06-235743 | 8/1994 |
| JP | A-06-342021 | 12/1994 |
| JP | A-07-055554 | 3/1995 |
| JP | A-07-229910 | 8/1995 |
| JP | A-7-260526 | 10/1995 |
| JP | A-09-178785 | 7/1997 |
| JP | A-9-304259 | 11/1997 |
| JP | A-10-132874 | 5/1998 |
| JP | A-10-170566 | 6/1998 |
| JP | A-11-220369 | 8/1999 |
| JP | A-11-264846 | 9/1999 |
| JP | A-2001-094395 | 4/2001 |
| JP | A-2001-119291 | 4/2001 |
| JP | A-2001-166008 | 6/2001 |
| JP | A-2001-177378 | 6/2001 |
| JP | A-2003-065768 | 3/2003 |
| JP | A-2003-194860 | 7/2003 |
| JP | A-2003-249905 | 9/2003 |
| JP | A-2003-307481 | 10/2003 |
| JP | A-2003-315356 | 11/2003 |
| JP | A-2005-020554 | 1/2005 |
| JP | A-2006-029874 | 2/2006 |
| JP | A-2007-060447 | 3/2007 |
| JP | A-2008-131500 | 6/2008 |
| JP | A-2009-229353 | 10/2009 |
| JP | A-2009-250807 | 10/2009 |
| JP | A-2009-250808 | 10/2009 |
| JP | A-2010-085286 | 4/2010 |
| JP | A-2010-127914 | 6/2010 |
| JP | A-2010-271210 | 12/2010 |
| JP | A-2010-271211 | 12/2010 |
| WO | WO 85-04487 A | 10/1985 |
| WO | WO 92/04634 A1 | 3/1992 |

OTHER PUBLICATIONS

Oct. 11, 2011 Office Action issued in U.S. Appl. No. 12/418,000.
Office Action issued Dec. 29, 2011 in U.S. Appl. No. 12/783,900.
Office Action issued Dec. 29, 2011 in U.S. Appl. No. 12/835,108.
Office Action issued Jan. 6, 2012 in U.S. Appl. No. 12/784,136.
Office Action mailed Mar. 7, 2012 in U.S. Appl. No. 12/418,000.
Jun. 5, 2012 Office Action issued in U.S. Appl. No. 12/418,000.
Office Action dated May 23, 2012 issued in U.S. Appl. No. 12/784,136.
Office Action dated May 30, 3012 issued in U.S. Appl. No. 12/783,900.
Jul. 23, 2012 Office Action issued in U.S. Appl. No. 12/835,108.
Jul. 31, 2012 Office Action issued in U.S. Appl. No. 12/418,000.
Sep. 14, 2012 Office Action issued in U.S. Appl. No. 12/784,136.
Sep. 27, 2012 Office Action Issued in U.S. Appl. No. 12/783,900.
Oct. 17, 2012 Office Action issued in U.S. Appl. No. 12/889,770.
U.S. Appl. No. 12/783,900 in the name of Todorokihara, filed May 20, 2010.
U.S. Appl. No. 12/835,108 in the name of Kondo filed Jul. 13, 2010.
U.S. Appl. No. 12/889,770 in the name of Todorokihara, filed Sep. 24, 2010.
U.S. Appl. No. 12/784,136 in the name of Todorokihara, filed May 20, 2010.
U.S. Appl. No. 12/418,000 in the name of Todorokihara, filed Apr. 3, 2009.
U.S. Appl. No. 12/896,106 in the name of Todorokihara, filed Oct. 1, 2010.
U.S. Appl. No. 13/211,726 in the name of Todorokihara, filed Aug. 17, 2011.
Nov. 13, 2012 Office Action issued in U.S. Appl. No. 12/896,106.
Nov. 28, 2012 Office Action issued in U.S. Appl. No. 12/418,000.
Feb. 6, 2013 Notice of Allowance issued in U.S. Appl. No. 12/784,136.
Jan. 31, 2013 Office Action issued in U.S. Appl. No. 12/889,770.
Jan. 14, 2013 Advisory Action issued in U.S. Appl. No. 12/783,900.
Jan. 28, 2013 Office Action issued in U.S. Appl. No. 12/783,900.
Apr. 8, 2013 Office Action issued in U.S. Appl. No. 12/835,108.

* cited by examiner

FIG. 14A  When influence of jitter can be canceled.
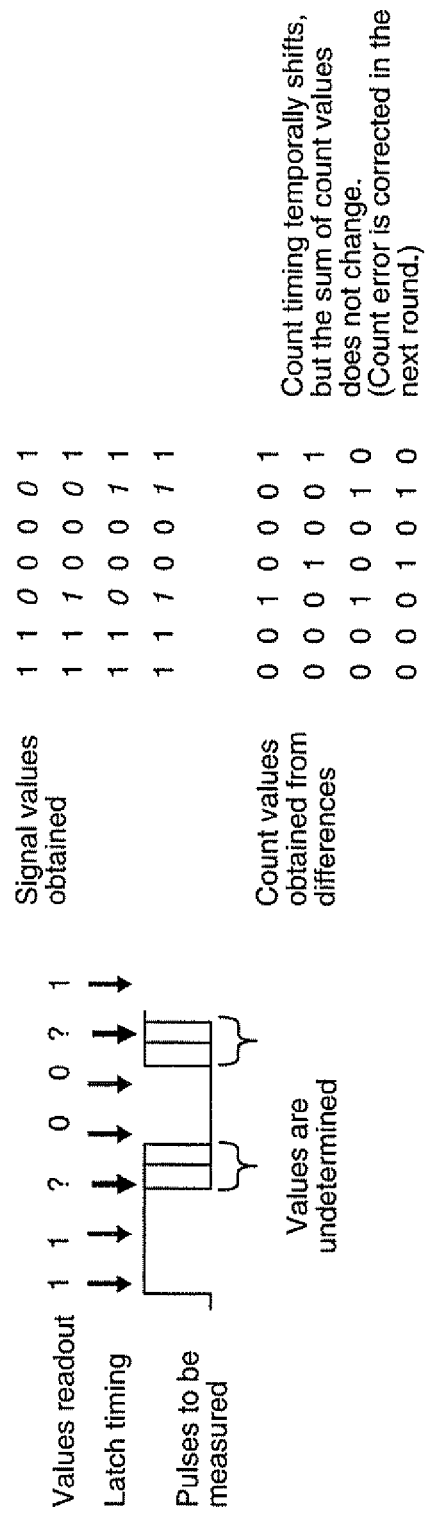
FIG. 14B  When influence of jitter appears.
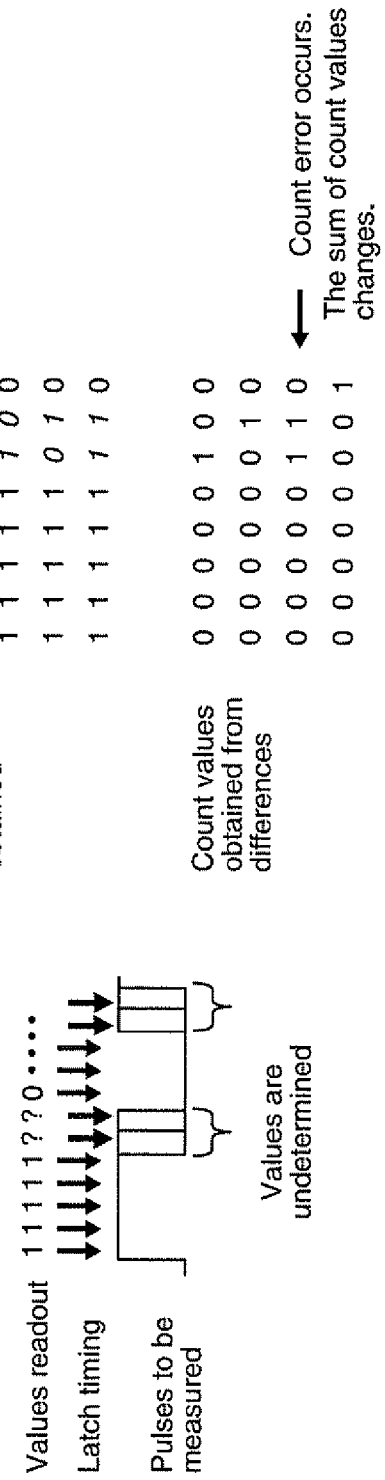

|  | Low frequency measurement | High frequency measurement | Multiplication | Jitter tolerance |
| --- | --- | --- | --- | --- |
| Direct count method | × | ○ | ○ | ○ |
| Reciprocal count method | ○ | × | × | × |
| Short gate time count method | ○ | ○ | ○ | ○ |

FIG. 15

FREQUENCY MEASUREMENT DEVICE

The entire disclosure of Japanese Patent Application No. 2009-121509, filed May 20, 2009 is expressly incorporated by reference herein.

BACKGROUND

1. Technical Field

The present invention relates to measurement devices and, in particular to frequency measurement devices capable of detecting small changes in frequency.

2. Related Art

As frequency measuring systems, a direct count system in which pulses passing within a predetermined gate time are counted (see, for example, Published Japanese Translation No. HEI 06-501554 of the PCT International Publication), and a reciprocal system in which a pulse period is correctly measured, and the frequency is obtained by the reciprocal of the time. The direct count system may be realized with a relatively small-scale circuit, but needs a longer gate time to obtain a higher frequency resolving power (for example, a gate time necessary to obtain a resolving power of 0.1 Hz is 10 seconds). The reciprocal system can overcome this shortcoming, but requires a greater scale circuit for accurately measuring pulse intervals, compared to that of the direct count system.

When a very small change in mass, such as, the presence or absence of odor substance adhered to a sensor, wants to be detected, a method using changes in the sensor frequency caused by the substance adhered may be considered. For example, a QCM (Quarts Crystal Microbalance) method that uses a quartz oscillator may be used to convert a very small change in mass at a substrate surface of the oscillator to a frequency change. For example, various types of odor sensors can be formed by providing materials to which odor compositions are adhered on surfaces of oscillator substrates. Odor compositions may be composed of a single substance or multiple substances. As sample gas is applied to an odor sensor, its odor compositions adhere to the sensor and change the mass at the surface of the oscillator, whereby the frequency of the oscillator changes. By observing changes at sensors in single kind or multiple kinds, the presence of specified odor compositions can be assumed.

In order to detect changes in the frequency of each of the odor sensors, it is necessary to provide a counter and a signal processing circuit for detecting changes in the frequency at an output of each of the sensors. Furthermore, although the frequency (for example, 30 MHz) of the quartz oscillator changes due to the adhered substance, such a change occurs only in the order of several Hz to several hundred Hz, and the change may be less than 1 Hz. As described above, the direct count system has a low frequency resolving power, and needs to provide a substantially long gate time to increase the frequency resolving power. Errors, such as, plus/minus 1 count errors and errors due to trigger-level jitter may occur at the time of measurement. In addition, when the gate time is made longer, errors that may originate from oscillation stability of the quartz oscillator are superposed on the aforementioned errors. The use of reciprocal system counters may supplement for such shortcomings as described above, but would not be suitable for a sensor array that is equipped with multiple sensors, because the counters each have a large-scale circuit.

SUMMARY

In view of the above, the applicant has been conducting research and development on novel measuring methods and measuring devices for measuring changes in frequency with improved frequency measurement resolving power.

As described below, the invention pertains to a method wherein a supplied pulse stream signal is continuously counted with a short gate time, whereby a series of count values that behave as a pulse stream corresponding to the frequency of the pulse stream signal is obtained, and high frequency components are removed from the series of count values to obtain a series of signals corresponding to the frequency of the pulse stream signal supplied, thereby extracting a frequency change. The method is hereafter referred to as a "short gate time count method."

It is desired for a frequency measuring device using the short gate time count method to increase its detection sensitivity without generating noise.

In accordance with an advantage of some aspects of the invention, it is possible to provide a frequency measuring device that is capable of expanding its dynamic range while suppressing generation of noise.

In accordance with an embodiment of the invention, a frequency measurement device measures a frequency of a signal to be measured including a pulse signal, wherein the frequency measuring device equipped with: a signal multiplier section that multiplies the signal to be measured by n (n is an integer) and outputs a multiplied signal; a counter section that counts the multiplied signal with a predetermined gate time and outputs a count value of the frequency of the signal to be measured at a predetermined period; and a low-pass filter that outputs a signal corresponding to the frequency of the signal to be measured based on the count value outputted at the predetermined period.

According to the structure described above, it is possible to obtain a frequency measuring device that has a broadened dynamic range through use of a multiplied signal obtained by multiplying a signal to be measured by n, with reduced noise that may be generated by jitter (positional changes of the time axis of a signal).

The signal multiplier section may preferably be formed from a phase locked loop (PLL) circuit. The use of a phase locked loop circuit as the n-multiplier section is preferable because noise caused by jitter is reduced not only in a stable state in which the frequency of the signal to be measured is stable but also in a transition state in which the frequency changes.

Further, the frequency measuring device may be further equipped with a frequency divider section that gives 1/n of a level or a numerical value of the output signal of the low-pass filter. As a result, the frequency of the signal to be measured can be obtained. It is noted that, to obtain information from a waveform changing pattern, it is sufficient to observe the output signal from the low-pass filter, and the frequency divider section in this case may not be an indispensable component of the invention.

The n-multiplication of the signal multiplier section and the n-division of the frequency divider section may preferably be variable. As a result, the dynamic range can be changed during operation. In particular, a phase locked loop circuit that uses a variable counter or the like is readily computer-controlled externally and thus is suitable for automation of measurement.

BRIEF DESCRIPTION OF THE DRAWINGS

FIGS. 14A and 14B are figures for describing the reason why count errors by jitter are reduced by the structure of the embodiment example.

FIG. 15 is a table for describing characteristics of frequency measuring systems, i.e., a direct count system, a reciprocal count system and a short gate time count system.

DESCRIPTION OF EXEMPLARY EMBODIMENTS

Preferred embodiments of the invention are described below with reference to the accompanying drawings. First, the outline of a frequency measuring device using a "short gate time count method" proposed in Laid-open patent application 2009-250807 is described with reference to FIGS. 1 through 7. Corresponding sections in the figures are appended with the same reference numbers.

Figure 1:
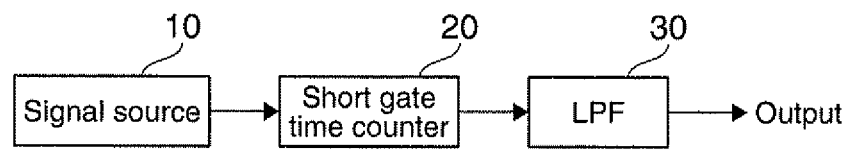
FIG. 1 is a diagram for describing a structure example of a frequency measuring device of a short gate time count system.

In FIG. 1, a signal source 10 generates a pulse stream signal. The signal source (a pulse generator) 10 may be, for example, a quartz oscillator with a predetermined frequency, for example, an oscillation frequency $f_0$ at 30 MHz, and corresponds to a detector section of an odor sensor, a gas sensor, a biosensor and the like. When odor substance adheres to the quartz oscillator, its oscillation frequency lowers according to the amount of adhered substance. The pulse stream signal is supplied to a short gate time counter section (hereafter also simply referred to as a "short gate counter") 20. The short gate counter 20 continuously counts pulses of the supplied pulse stream signal with a short gate time (with a predetermined gate time) without interruption. The count values are in a corresponding relation with the frequency (reciprocal of the pulse time interval) of the pulse stream signal, and are successively supplied to a low-pass filter (LPF) 30.

It is noted that, in the present specification, the sampling frequency means a reciprocal of the gate time described above.

Figure 2:
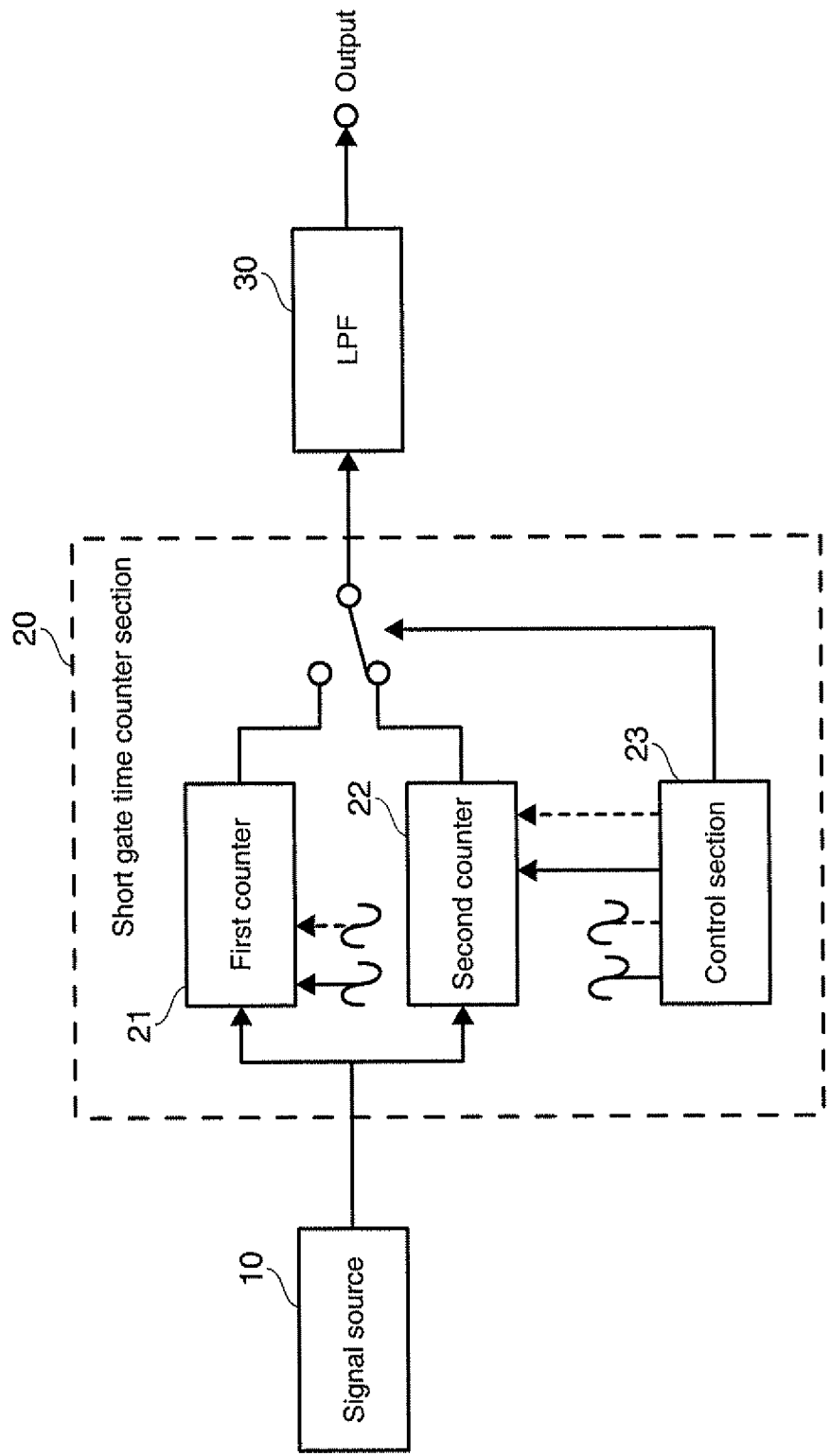
FIG. 2 is a diagram for describing a structure example of a short gate time count section.

FIG. 2 shows a first example of the structure of a short gate counter section 20. It is desired that the short gate counter section 20 measures a pulse stream signal supplied from the signal source without interruption (without having an insensitive period for the inputted signal).

Accordingly, the first embodiment example is provided with two counters, a first counter 21 and a second counter 22. A pulse stream signal is supplied to both of the first counter 21 and the second counter 22. A control section 23 transmits a gate signal and a reset signal to each of the counters such that outputs from the both counters are supplied to a low-pass filter 30 through a switch. Measured values are alternately outputted from the two counters, such that, while one of the counters is counting, the other counter performs resetting or transferring data, thereby avoiding an insensitive period that may be generated during resetting of the counter and transferring data. It is noted that the control section 23 may be implemented as hardware, but may also be implemented by software using a personal computer or the like.

Figure 3:
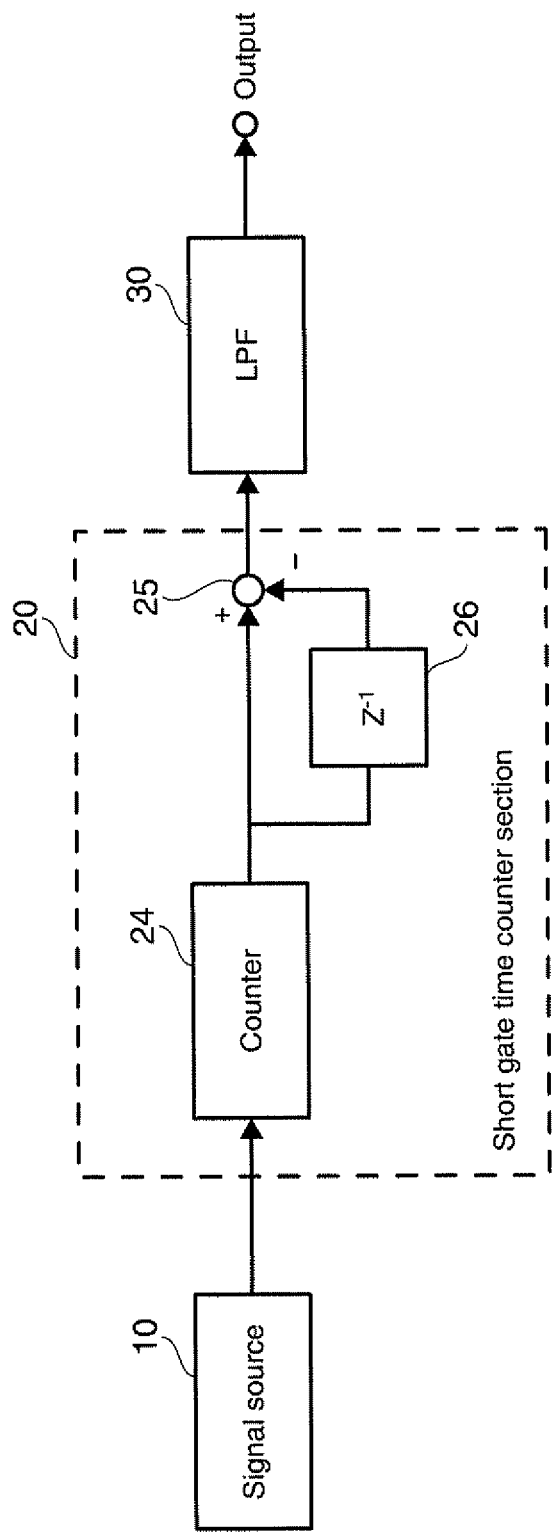
FIG. 3 is a diagram for describing another structure example of a short gate time count section.

FIG. 3 shows a second example of the structure of the short gate counter section 20. This embodiment example uses a single counter 24. The counter 24 is a counter of a direct count system, and always counts sampled pulse signals and outputs their cumulative value (does not reset the values). The output of the counter 24 is sent to a subtractor 25 and a register 26 that retains a previous cumulative value. The subtractor 25 subtracts the previous cumulative value from a latest cumulative value outputted from the counter 24 to obtain a latest count value, and supplies the same to the low-pass filter 30. Overall operations of the device are generally the same of those of the measurement device shown in FIG. 1.

Figure 4:
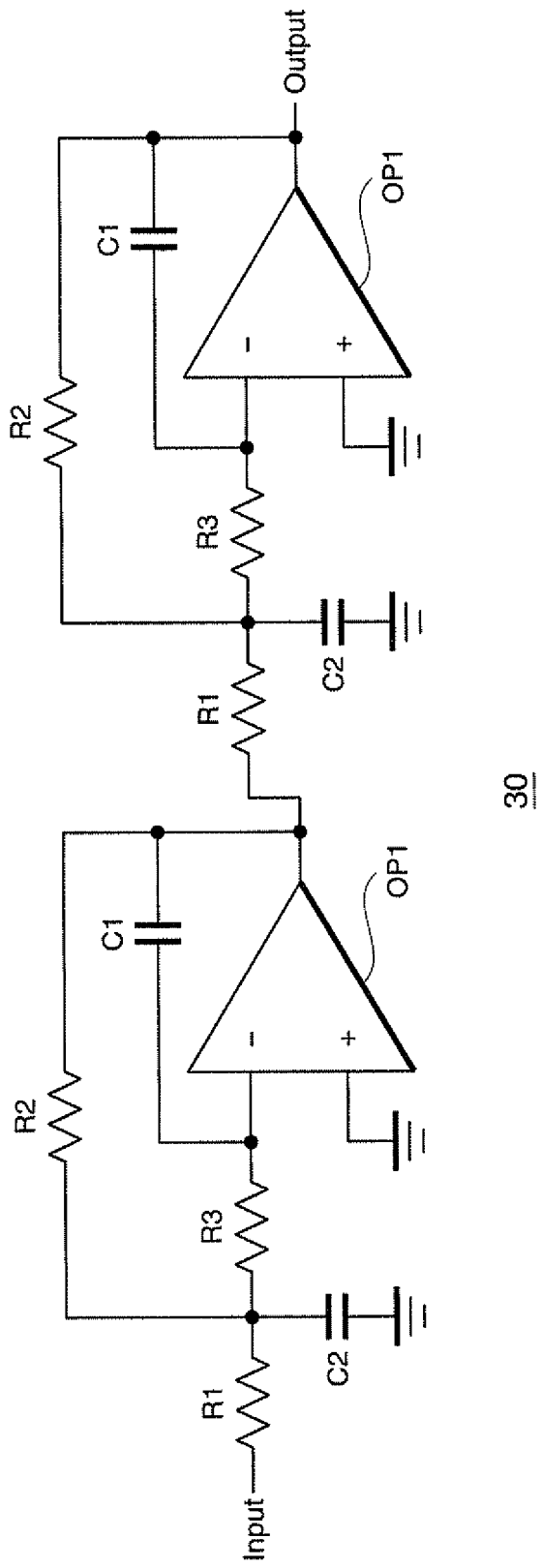
FIG. 4 is a circuit diagram for describing a structure example of a low-pass filter (analog).

FIG. 4 shows an example in which the low-pass filter 30 is formed from an analog circuit. In this example, low-pass filters, each composed of resistors R1-R3, capacitors C1 and C2 and an operation amplifier OP1, are connected in two stages. When the short gate counter 20 outputs data in one-bit serial, the data can be inputted in the low-pass filter 30 as is. When the short gate counter 20 outputs data in n-bit, the data can be inputted through an unshown D-A converter in the low-pass filter 30.

Figure 5:
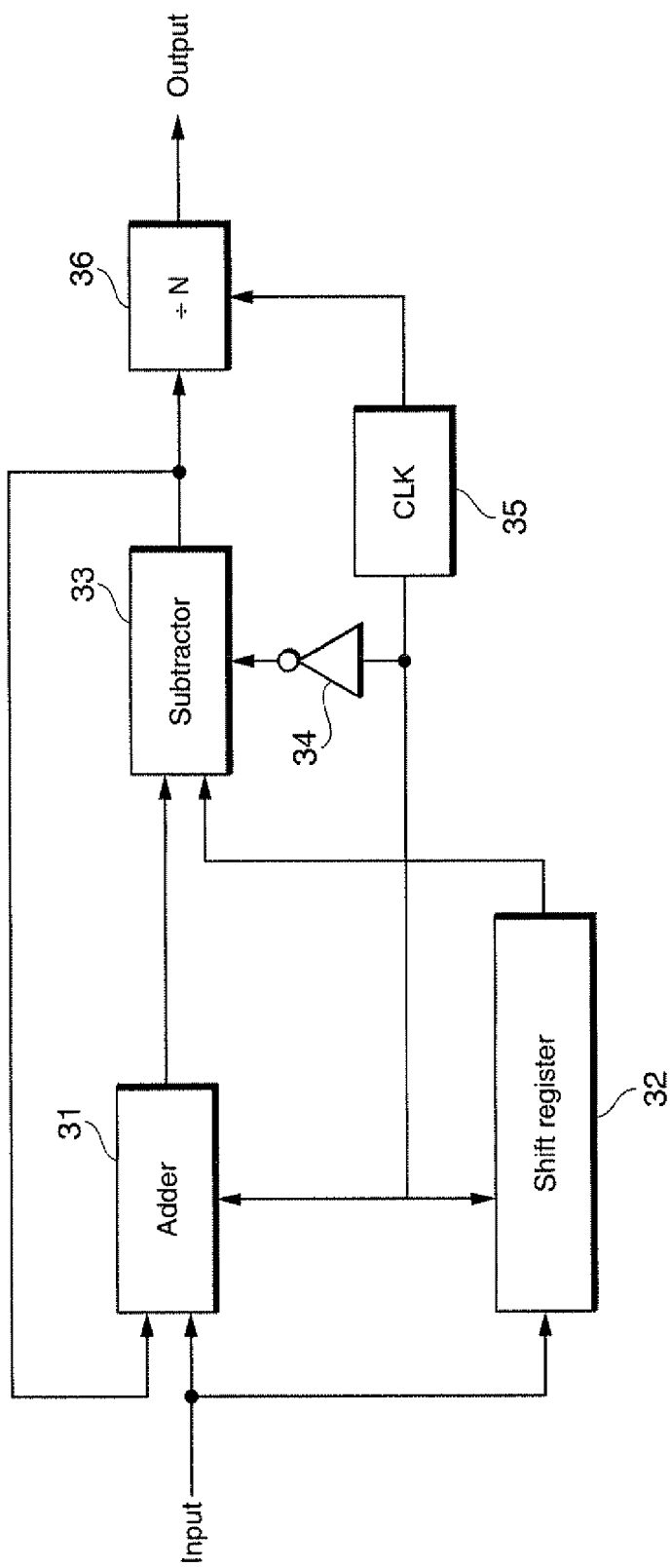
FIG. 5 is a block diagram for describing a structure example of a low-pass filter (digital).

FIG. 5 shows an example of the structure of the low-pass filter 30 that is formed from a moving average filter (a digital filter). The low-pass filter 30 in the figure has an adder 31, a shift register 32, a subtractor 33, an inverter 34, a control section 35 that supplies operation timing clocks to each of the sections, and a divider 36.

Counted values outputted from the counter are given to both of the adder 31 and the shift register 32 that is equipped with storage regions corresponding to the tap number. N number of data that are subject to average value calculation sequentially move in synchronism with other data within the shift register 32. The total value obtained in a previous calculation is supplied to the other input of the adder 31, and the adder 31 adds the latest count value with the previous total value. The counted value in the leading (old) data in the shift register 32 is removed from the cumulative added value by the subtractor 33, and the result is set as a latest total value. The latest total value is returned as a previous total value to the adder 31, and the latest total value is also divided by the number of subject data N by the divider 36. The calculation described above is performed for the entire data, whereby moving average values can be obtained. It is noted that the divider has a function of scaling the output values to a frequency (Hz), but such function may be omitted if the scaling is not of concern. Also, when the moving average filter is formed in multiple stages, the divider may be provided only at the last stage. The divider 36 may be provided with a function as a divider 50 to be described below.

Figure 6:
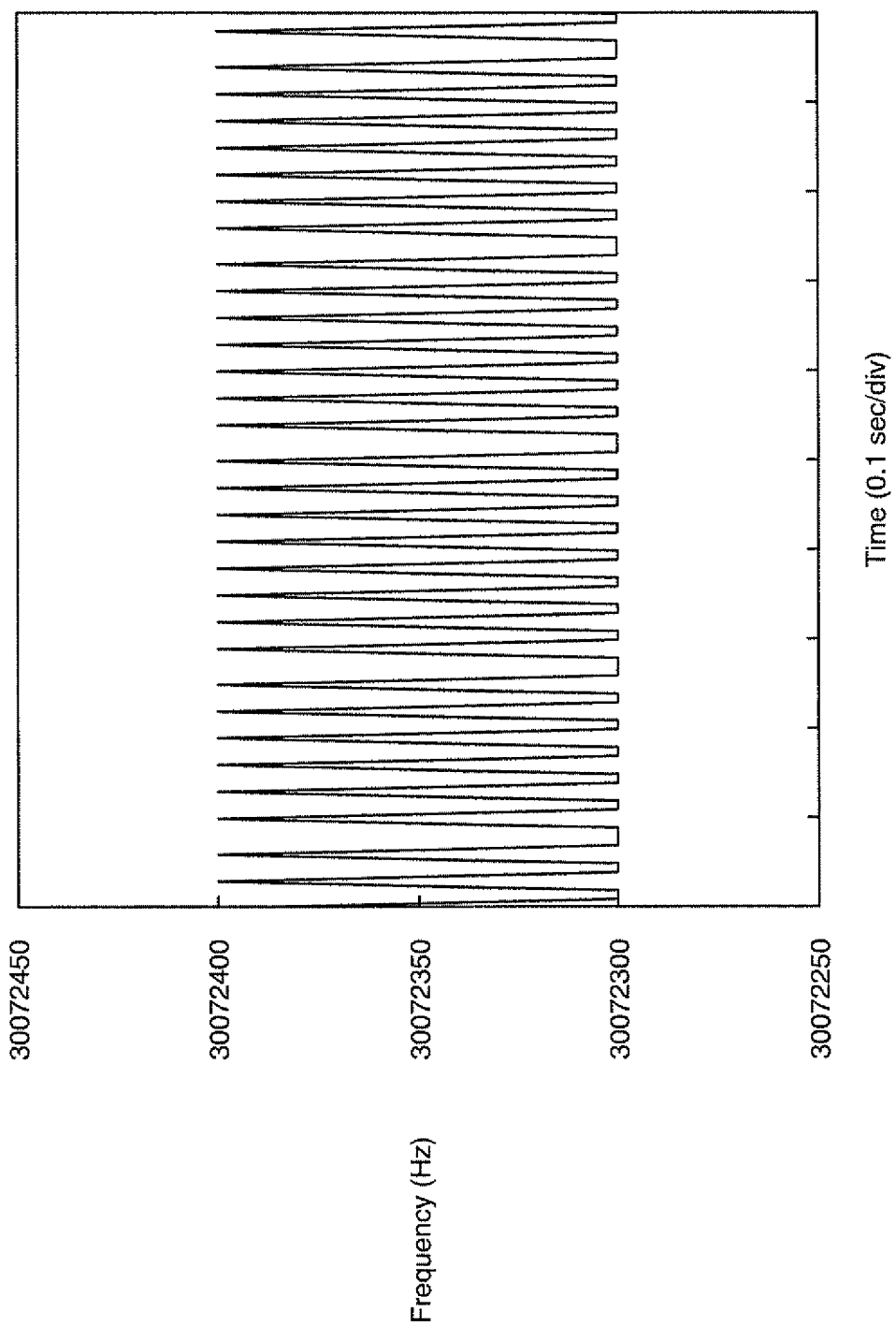
FIG. 6 is a graph for describing an output example of the short gate time count section.

FIG. 6 shows an example of outputs of the count values at the short gate time counter 20. In this example, the pulse stream signal is counted at a sampling frequency of 100 Hz (at a gate time of 0.01 seconds). When the sampling frequency is 100 Hz, the frequency resolving power also lowers to 100 Hz. Therefore, information lower than 100 Hz of the supplied pulse stream signal cannot be detected by one counted value alone, but 100 counted values can be obtained in one second. The frequency that is 100 times the counted value is distributed in pulses along the time axis between 30,072,300 Hz and 30,072,400 Hz.

Here, the quantization error (±1 count error) in sampling is described. For example, the case where a pulse stream signal that is stable at 123.34 Hz is measured by a counter of the direct count system is examined.

When the gate time is 10 seconds: there are 1233 counts or 1234 counts at each 10 seconds.

By multiplying these count values by 1/10, 123.3 Hz or 123.4 Hz is displayed (at each 10 seconds). (The measurement error is 0.1 Hz.)

When the gate time is 1 second: there are 123 counts or 124 counts at each one second.

123 Hz or 124 Hz is displayed (at each one second). (The measurement error is 1 Hz.)

When the gate time is 0.1 second: there are 12 counts or 13 counts at each 0.1 second.

By multiplying these count values by 10, 120 Hz or 130 Hz is displayed (at each 0.1 second). (The measurement error is 10 Hz).

When the gate time is 0.01 second: there is one count or two counts at each 0.01 second.

By multiplying these count values by 100, 100 Hz or 200 Hz is displayed (at each 0.01 second). (The measurement error is 100 Hz).

When a pulse stream signal that is stable at one spot frequency is counted, the counted values are distributed in a pulse stream having an amplitude between two values that are determined by the gate time. On the other hand, even when the frequency of a pulse stream signal to be counted changes, if the changes are within the range of the measurement error, the counted values are likewise distributed in a pulse stream with an amplitude between two values. For example, in the case of the gate time being 0.01 second, if changes in the frequency of a pulse stream signal to be counted are contained between 100 Hz and 200 Hz, a measurement value of 100 Hz or 200 Hz can be also obtained.

As shown in FIG. 6, in the system in which sampling is conducted at a short gate time that is less than one second, count values behave like a pulse stream, and frequency (coarseness and fineness) of the pulse stream changes according to changes in the frequency that is measured. The magnitude of the oscillation frequency corresponds to the level of density of the pulse stream. Information about the frequency of a pulse stream signal counted exists in low-band components of the frequency spectrum of the count values that behave as a pulse stream. Accordingly, the low-band components are extracted (harmonic components originating from quantization errors are removed) from the count values by a low-pass filter, whereby the information about the frequency of the pulse stream signal counted can be decoded.

Figure 7:
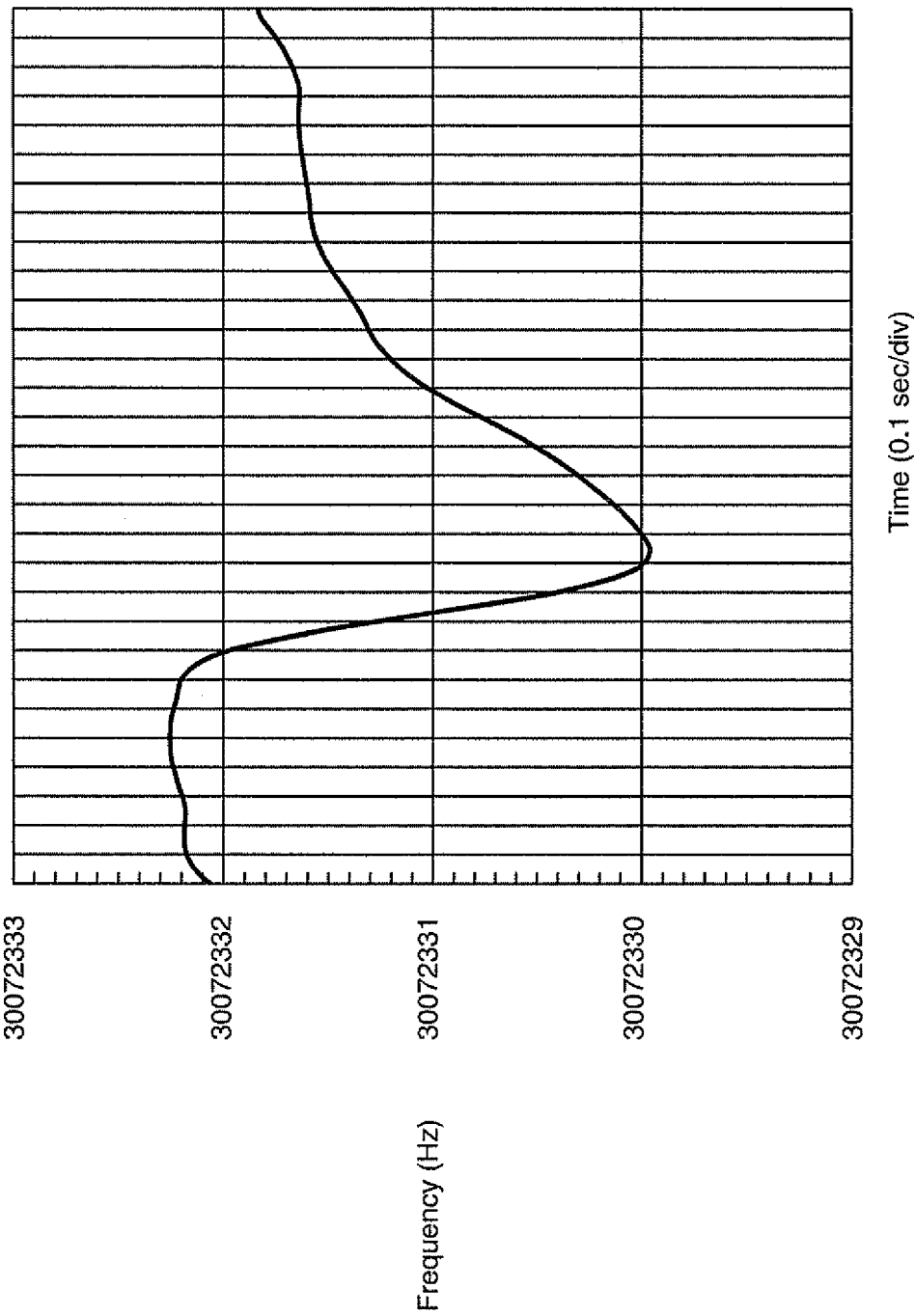
FIG. 7 is a graph for describing an output example of the low-pass filter.

FIG. 7 shows an example in which high frequency components are removed by feeding the above-described stream of count values (shown in FIG. 6) to a (digital) low-pass filter with the tap number being 512. As shown in the figure, the changes in the frequency of the pulse stream signal supplied are outputted as a continuous (analog) curve. Frequency changes in a region that cannot be measured by counting with a sampling period at 100 Hz, in particular, frequency changes less than 1 Hz, can be detected.

In this manner, according to the short gate time count system, by shortening the gate time (making the sampling frequency higher), a stream of many measurement values can be obtained even though each measurement error becomes greater, high frequency components can be removed by a low-pass filter, and therefore the frequency measurement resolving power is improved. As the circuit scale can be suppressed to a small scale, multichannel implementation can be readily made. With an analog low-pass filter, the present embodiment is also applicable to analog outputs.

The short gate time count system has the advantages described above. In addition, as a result of various experiments conducted, it has been found that, when the counter of the short gate time count system described above is combined with a multiplier to expand the dynamic range of the counter, and when combined with a PLL (Phase Locked Loop circuit) multiplier as the multiplier, noise was further reduced.

Figure 8:
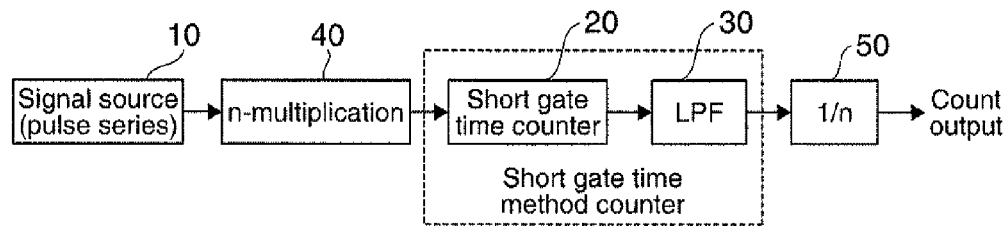
FIG. 8 is a diagram for describing a structure of a frequency measuring device of a short gate time count system in accordance with an embodiment example.

FIG. 8 shows the structure of a frequency measuring device in accordance with an embodiment example of the invention. Sections in the figure corresponding to those shown in FIG. 1 are appended with the same reference numbers.

A signal to be measured, that is a pulse stream signal at a frequency fo, is supplied to an n-multiplier section 40 from a signal source 10 that is made of a quartz oscillator or the like. It is noted that the signal to be measured is not limited solely to a pulse signal, but may be any signal that includes a pulse signal. As described below, the n-multiplier section 40 is formed from a PLL circuit. The signal to be measured is multiplied by the n-multiplier section 40 to a frequency being n times fo (nfo), and a frequency change in the signal to be measured is also multiplied by n (n is an integer), and supplied to a short gate time count section 20. The short gate time count section 20 repeats counting of the signal to be measured with a sampling frequency less than one second, for example, with a sampling frequency at 1 kHz (0.001 second), and outputs a stream of count values along the time axis with a density corresponding to the frequency of the signal to be measured to a low-pass filter 30 (see FIG. 6).

The low-pass filter 30 may be formed from a digital filter or an analog filter, as described above. The low-pass filter 30 removes high frequency components from the count value stream, thereby extracting a frequency change component of the signal to be measured. The output of the low-pass filter 30 is supplied to an n-frequency divider section 50. The frequency divider section 50 may be formed from a frequency divider or a level voltage divider, and gives 1/n (an integer value) of the value or the level of the output of the low-pass filter 30. By this operation, a value (level) corresponding to the frequency of the original signal to be measured can be obtained.

It is noted that, when observing changes in the frequency, for example, when determining adhesion of odor substance to an unshown quartz oscillator sensor of the signal source 10 according to a frequency change pattern, such changes can be observed with the output value (or the level) of the low-pass filter 30. In this case, the frequency divider section may be omitted.

Figure 9:
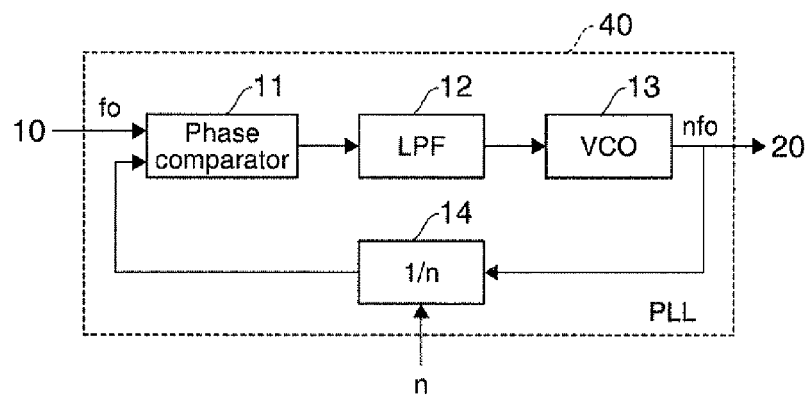
FIG. 9 is a diagram for describing a structure example of a multiplier section with a PLL circuit.

FIG. 9 shows the structure of the n-multiplier section 40. The n-multiplier section 40 is formed from a PLL (phase locked loop) circuit that includes a phase comparator 11, a low-pass filter 12, a VCO (voltage controlled oscillator) 13, and a 1/n frequency divider 14. Such a structure is favorable when computer-controlling the frequency measuring device externally.

The frequency divider 14 is formed, for example, from a variable counter, and the value n can be set externally. The phase comparator 11 compares phases of an output signal with a frequency fs of the frequency divider and a signal to be measured with a frequency fo, and generates an output with a pulse width corresponding to a phase difference. The difference signal is smoothed by the low-pass filter 12, and applied to a voltage control input terminal of the VCO 13.

The VCO 13 oscillates at a frequency nfo according to the applied voltage. A pulse stream output with the frequency nfo of the VCO 13 is supplied to a short gate counter 20 and a frequency divider 14 in a succeeding stage. By the phase synchronization loop with the frequency divider 14 (nfo/n=fs), the phase comparator 11, the low-pass filter 12 and the VCO 13, the output frequency nfo of the VCO 13 is set to n times that of the signal to be measured fo.

Figure 10:
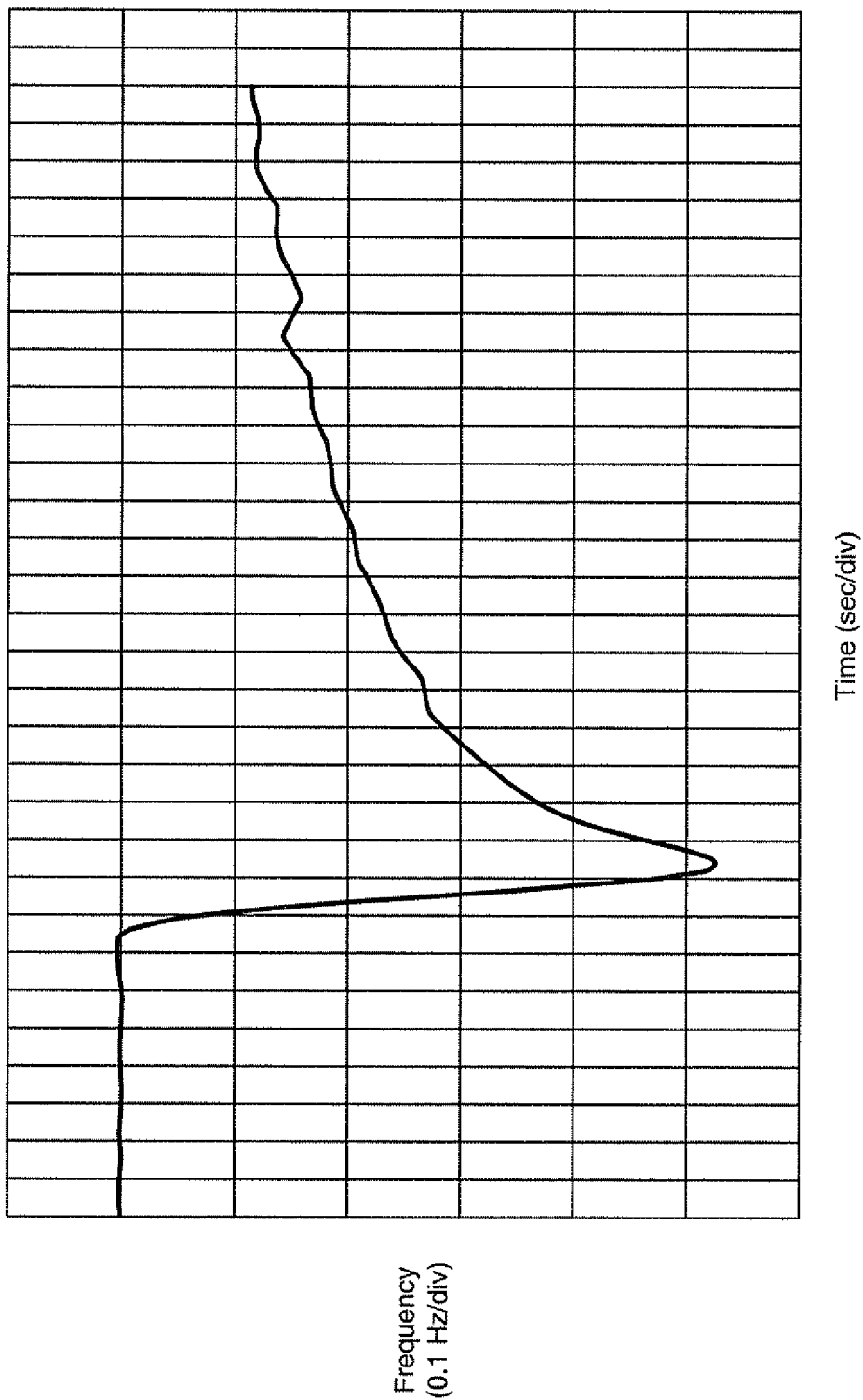
FIG. 10 is a graph for describing an example of measurement of a frequency (PLL is used, n=10).

FIG. 10 shows an example of changes in the frequency of the quartz oscillator sensor (the signal source 10) observed by the frequency measuring device that uses the PLL multiplier section 40 described above. In this example, the PLL circuit multiplies the frequency fo of the signal to be measured (pulse stream) by 10 (n=10). The sampling frequency of the short gate time counter section 20 is 1 kHz, and the tap number of the low-pass filter is 3000. The graph in FIG. 10 shows changes in the frequency of the crystal oscillator from the time when water vapor particles that are fine particles adhered to the quartz oscillator sensor in a stable state until the time when the water vapor particles separated from the sensor. The frequency lowers immediately after the adherence of the water vapor, and the frequency elevates toward the stable state with separation of the water vapor (which is similar in the other graphs).

Figure 11:
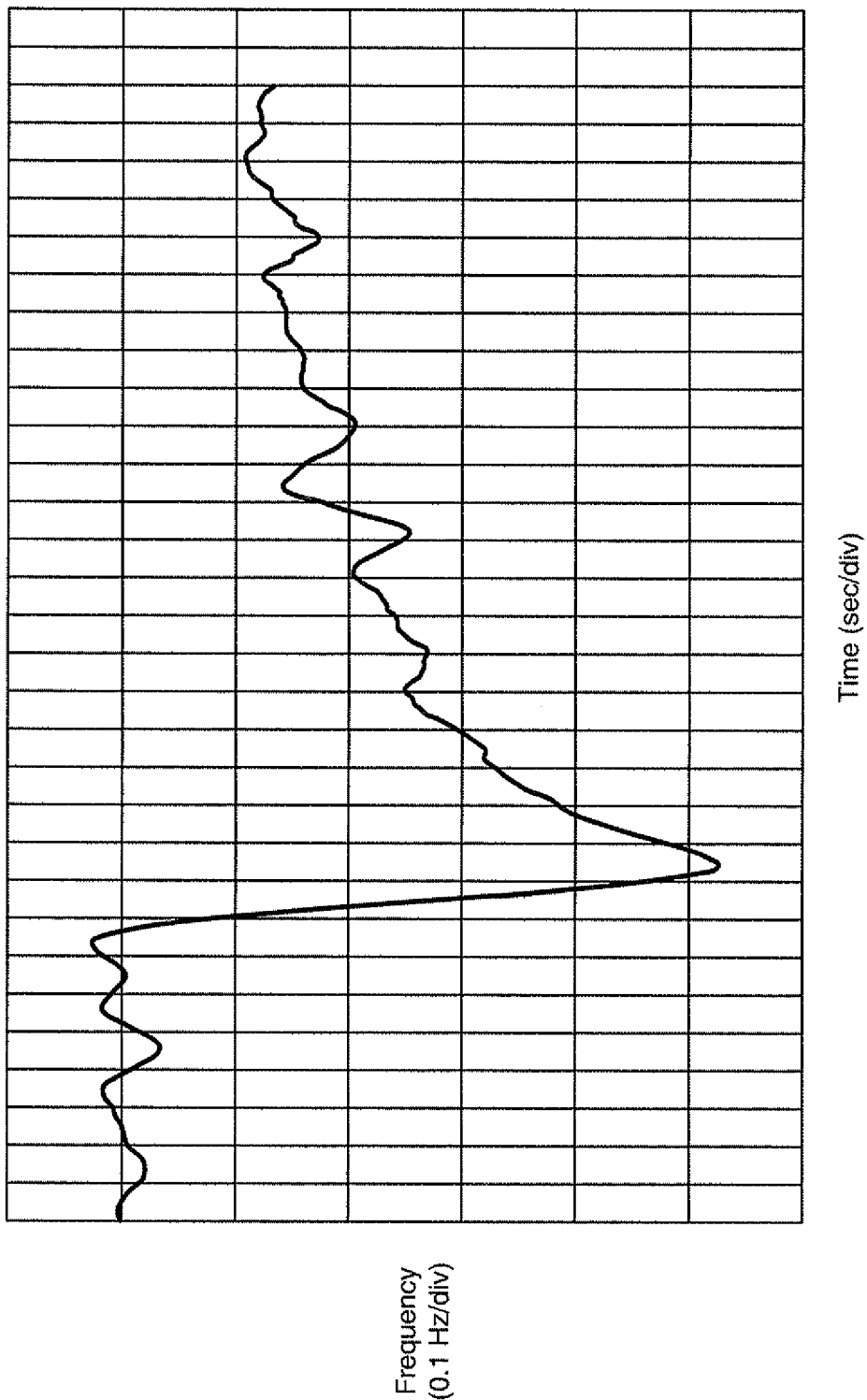
FIG. 11 is a graph for describing an example of measurement of a frequency (PLL is used, n=1).

FIG. 11 shows an example obtained by measurement under similar conditions without conducting multiplication by the PLL circuit (n=1). By comparing the output curves in FIG. 10 and FIG. 11, it is observed that, according to the output curve in FIG. 10, noise in the stable state and noise in the transition state in which the level changes are both suppressed. It is believed that, by multiplying the frequency of the signal to be measured, the pulse width of the multiplied signal to be measured becomes relatively narrower with respect to the sampling interval of the short gate time counter 20, whereby jitter of the signal to be measured (changes in rising and falling positions of the pulses) also becomes relatively reduced, such that count errors by the jitter are reduced. It is also believed that jitter noise is reduced because additional pulses are disposed at intervals as equal as possible among the pulses of the signal to be measured.

Figure 12:
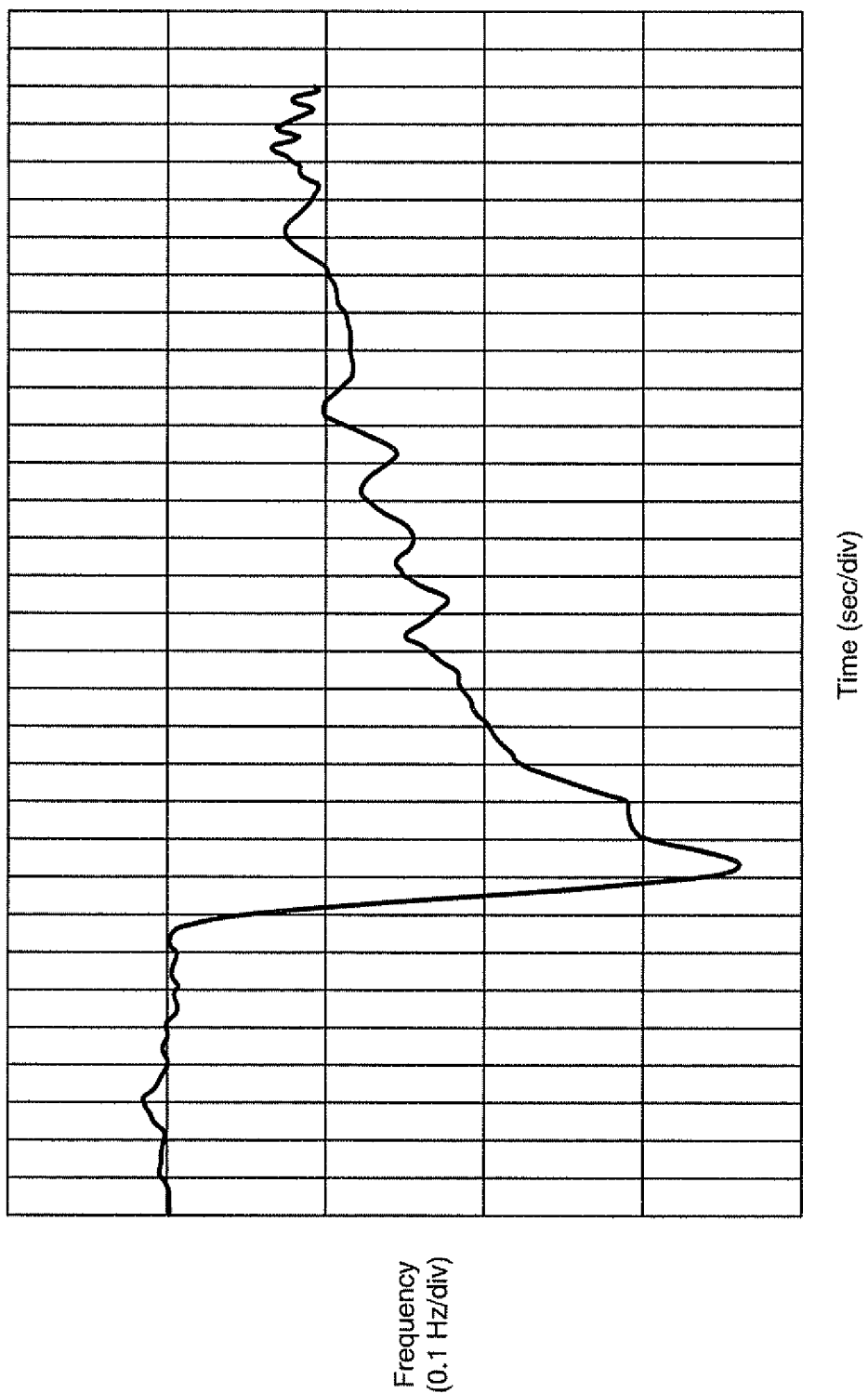
FIG. 12 is a graph for describing an example of frequency measurement (double multiplication with a logical circuit).

FIG. 12 shows an example of outputs of a frequency measuring device in which the multiplier section 40 described above is formed from logical gates, and when the multiplication number n is set at 2 (n=2). The sampling frequency of the short gate time counter section 20 is 1 kHz, and the tap number of the low-pass filter is 3000.

Figure 13:
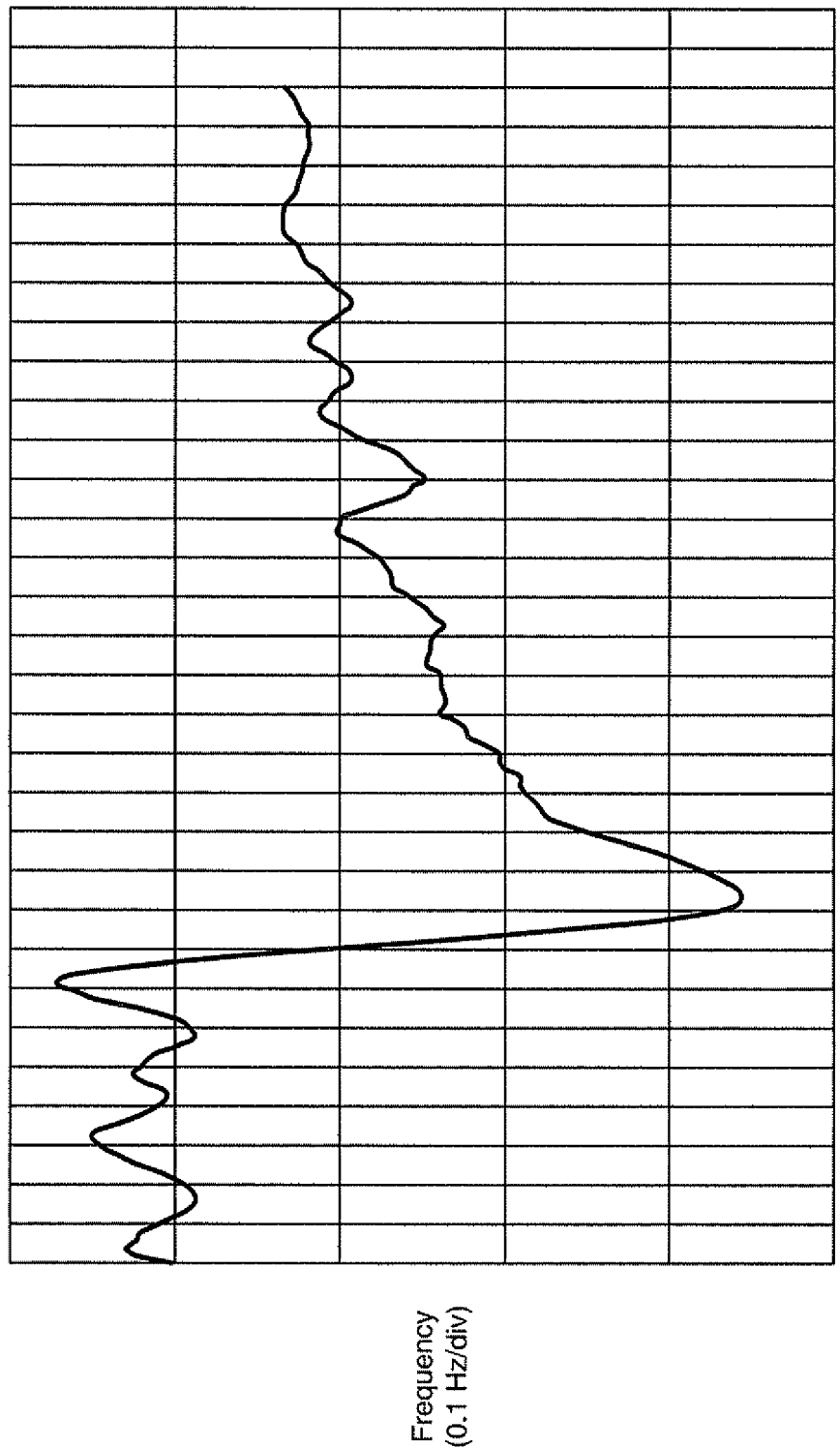
FIG. 13 is a graph for describing an example of frequency measurement (without using the multiplier section).

FIG. 13 shows an example of outputs of a frequency measuring device that is not provided with the multiplier section 40 with the multiplication number being 2 in FIG. 12, wherein the outputs are obtained under the same conditions as those of FIG. 12 (with an ordinary short gate time counter as shown in FIG. 1). The sampling frequency of the short gate time counter section 20 is 1 kHz, and the tap number of the low-pass filter is 3000.

By comparing the output curves in FIG. 12 and FIG. 13, it is observed that, when n=2, noise in a stable state is reduced more than that in the ordinary state. Noise in a transition state is also reduced. Also, by comparing the output curves in FIG. 10 (PLL, n=10) and FIG. 12 (non PLL, n=2), it is observed that, when the PLL multiplier section is used, the reduction of noise in a transition state, in particular, is considerable.

FIGS. 14A and 14B are figures for explaining the reason why count errors by jitter are reduced by the structure of the embodiments.

As shown in FIG. 14A, even when time base jitter is present between the pulses to be measured and the latch timing (sampling timing), if the jitter is within the interval of the latch timing, the sum of count values would not change, and influence of the jitter does not appear.

On the other hand, as shown in FIG. 14B, when time base jitter is present between pulses to be measured and the latch timing (sampling timing), and the jitter exceeds the interval of the latch timing, the sum of count values changes, such that the count values include errors, and influence of the jitter appears. By comparing FIG. 14A and FIG. 14B, when the latch timing interval is constant, it is observed that, the narrower the width of changes in the pulses to be measured, the more difficult the read errors would occur. Therefore, by increasing the frequency of the pulses to be measured (when the signal to be measured is multiplied by n), jitter noise can be reduced.

FIG. 15 is a table that compares the characteristics of the "short gate time count system of the embodiment example, and a "direct count system" and a "reciprocal count system" of related art in frequency measurement.

Frequency Measurement

As for ±1 count errors of the direct count system that measures the number of pulses within a predetermined time, the proportion of the errors is reduced as the frequency to be measured becomes greater. Therefore the direct count system is suitable for measurement of high frequency. The resolving power of the reciprocal system that measures the periods between pulses does not depend on absolute values of the frequency to be measured, such that the reciprocal system fully exhibits its power in measurement of low frequency. The short gate time count system obtains a frequency from the density of a stream of count values, and thus can increase the measurement accuracy by increasing the sampling frequency (a reciprocal of the gate time) without regard to low frequency or high frequency.

Effect of Multiplication

In the case of the short gate time count system and the direct count system, when a signal to be measured is n-time multiplied, the frequency resolving power is increased n-folds. In the case of the reciprocal system, the frequency resolving power does not depend on absolute values of the oscillation frequency, such that no effect can be obtained in multiplying the signal to be measured.

Jitter Tolerance

In the case of the direct count system, jitter causes ±1 count errors, but its influence is small. In the case of the reciprocal system, pulse intervals are measured, and therefore the resolving power is lowered due to direct influence of jitter. In the case of the short gate time count system, influence of jitter can be cancelled.

As described above, the combination of the n-multiplication PPL circuit and the frequency measuring device of the short gate time count system is favorable because noise in output signals can be reduced.

The frequency measuring device using the system according to the embodiment has a small circuit scale, and its mounting is easy, such that the device can be made smaller in size and lighter in weight at low cost. For example, it may be favorably used for size-reduction implementation and higher resolving power implementation of various types of sensors using quartz crystal, and for AD converter elements. Also, the frequency measuring device using the system according to the embodiment may be favorably used for integration and platform implementation of various types of sensors using quartz crystal. The frequency measuring device of the present embodiment may also be favorably used for transducer arrays for odor sensors, gas sensors, biosensors, and the like.

What is claimed is:

1. A frequency measurement device that measures a frequency of a signal to be measured including a pulse signal, the frequency measuring device comprising:
   a signal multiplier section that multiplies the signal to be measured by n (n is an integer), and that outputs a multiplied signal;
   a counter section that counts the multiplied signal during a gate time, and that outputs a count value of the frequency of the multiplied signal; and
   the low-pass filter that outputs an output signal based on the count value.

2. The frequency measurement device according to claim 1, wherein the signal multiplier section includes a phase locked loop circuit.

3. The frequency measurement device according to claim 1, further comprising a frequency divider section that gives 1/n of a level or a numerical value of the output signal of the low-pass filter.

4. The frequency measurement device according to claim 1, wherein the n is a variable.

* * * * *